United States Patent [19]

Cielo et al.

[11] Patent Number: 4,546,458
[45] Date of Patent: Oct. 8, 1985

[54] FREQUENCY MODULATED LASER DIODE

[76] Inventors: Paolo G. Cielo, 8300 rue Sherbrooke East, Montreal, Quebec, Canada, H1L 6K9; Garfield W. McMahon, 23 Ernest Ave., Dartmouth, N.S., Canada, B3A 2H6

[21] Appl. No.: 378,678

[22] Filed: May 17, 1982

[30] Foreign Application Priority Data

May 27, 1981 [CA] Canada ................................. 378436

[51] Int. Cl.$^4$ ............................ G01V 1/38; H01S 3/00
[52] U.S. Cl. ..................................... 367/149; 332/7.51; 350/96.14; 350/358; 372/26; 372/28; 455/605; 455/611; 455/613
[58] Field of Search ................ 332/7.51; 350/96.14, 350/358; 372/26, 28; 455/605, 611, 613; 367/149

[56] References Cited

U.S. PATENT DOCUMENTS

| | | | |
|---|---|---|---|
| 3,243,722 | 3/1966 | Billings | 455/611 |
| 3,330,957 | 7/1967 | Runnels | 372/28 |
| 3,482,189 | 12/1969 | Fenner | 332/7.51 |
| 3,530,400 | 9/1970 | Pratt, Jr. et al. | 372/28 |
| 3,903,497 | 9/1975 | Stimler et al. | 455/613 |
| 4,071,753 | 1/1978 | Fulenwider et al. | 455/613 |
| 4,422,167 | 12/1983 | Shajenko | 367/149 |
| 4,436,425 | 3/1984 | Cole | 367/149 |

FOREIGN PATENT DOCUMENTS 1124384 5/1982 Canada .

*Primary Examiner*—S. C. Buczinski
*Attorney, Agent, or Firm*—Saul Elbaum; Thomas McDonald; Anthony T. Lane

[57] ABSTRACT

A method of modulating the output of a solid state diode laser by directly straining the laser chip. The chip is mechanically coupled to a transducer such as a piezoelectric crystal in such a manner that a dimensional variation in the transducer is translated into a corresponding variation in the chip. It is contemplated that the modulated output will have application in communication systems and in particular a hydrophone system.

5 Claims, 11 Drawing Figures

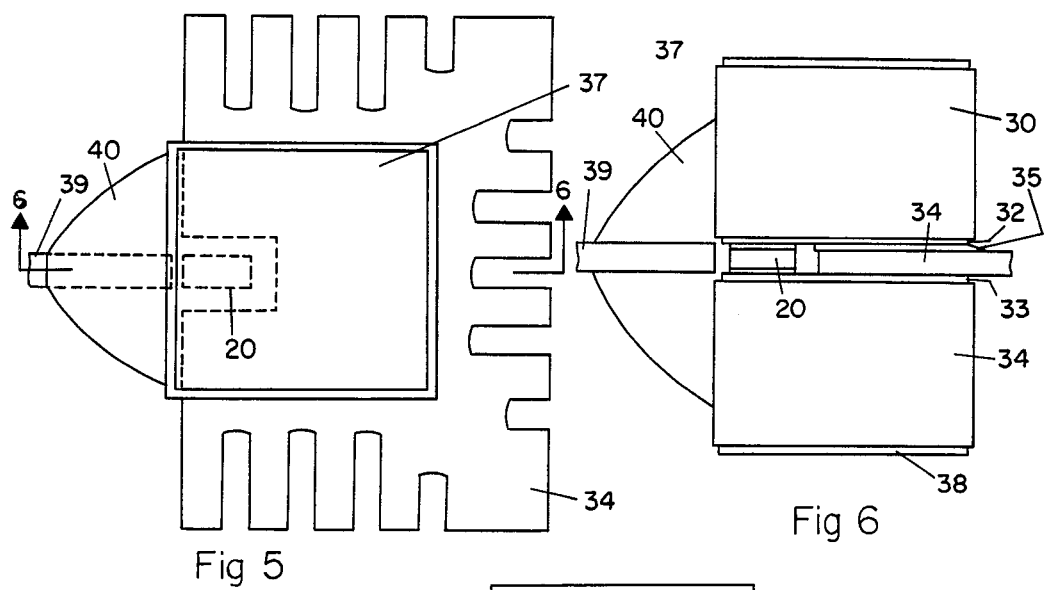
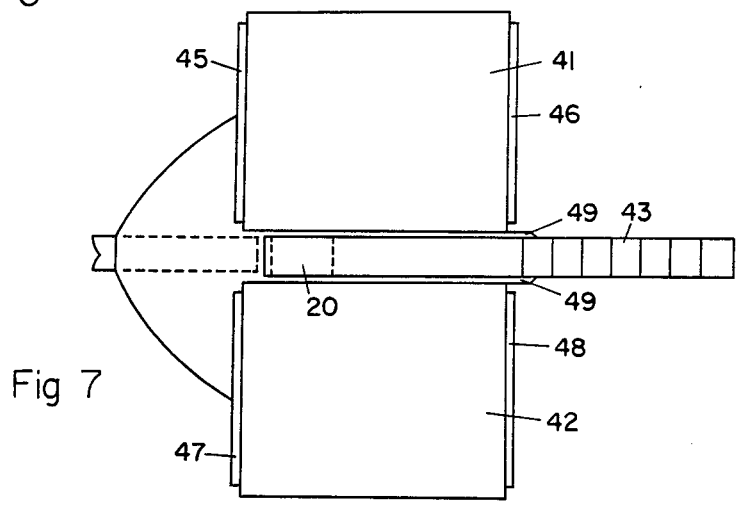
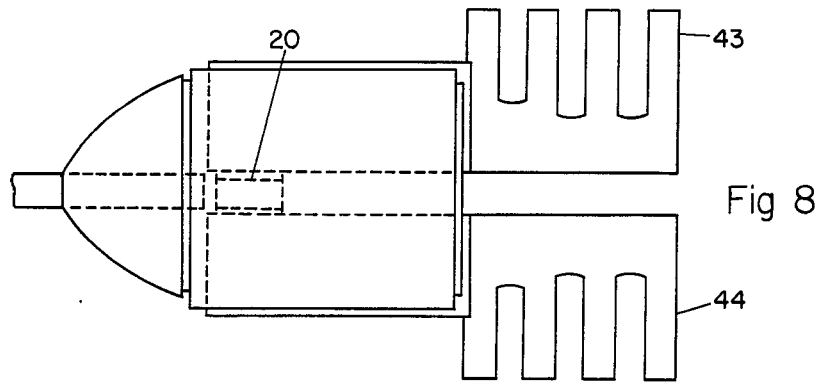

FREQUENCY MODULATED LASER DIODE

The invention described herein may be manufactured, used or licensed by or for the government of the United States of America for governmental purposes without payment to us of any royalties therefor.

The invention relates to a method whereby the output of a solid state diode laser may be modulated by directly straining the laser chip. The invention contemplates the use of a solid state diode laser source whose output is modulated by the aforementioned method in a communication system in which the modulated laser output is transmitted to a remote detector through the atmosphere or via an optical fiber. More particularly, the method is adaptable for use in a hydrophone system.

The small size, relatively low power requirements, environmental ruggedness and compatability with known detectors, renders the solid state diode laser particularly well suited for use as a radiation source in line of sight communication systems and systems involving optical fibers as the transmission medium. Information concerning structures and operational characteristics of solid state diode lasers may be found in Procedings of the IEEE Vol. 64, pp. 1512-1240, October 76; (M. B. Panish).

A fiber-optic hydrophone using a Fabry-Perot sensing cavity is described in a co-pending patent application to P. G. Cielo and G. W. McMahon, "Stable fiber-optic hydrophone", Canadian application Ser. No. 333,603. In that system a light beam is introduced into an optical fiber containing a local cavity, whose length can be varied by a piezoelectric transducer, and sensed by a remote cavity of equal length. The local cavity length is made to follow the length of the sensing cavity by a feedback circuit, thus retrieving a signal which is a function of the pressure to which the remote cavity is subjected.

A diode laser is a particularly appropriate choice as the optical source, because of the aforementioned features, namely small size, suitability for fiber coupling, convenient emission wavelength and low cost. However, in the system of application Ser. No. 333,603 the presence of two passive cavities along the fiber introduces a certain amount of attenuation of the optical beam, particularly if high reflectivity reflectors are used for the cavities. Moreover, the demodulation curve for a double-cavity system is less sharp and provides a lower index of modulation than a single-cavity demodulation curve, which would be obtained if a single-mode laser and a single Fabry-Perot cavity were used. Single mode lasers are presently available but they are expensive and easily detuned.

The system proposed herein introduces a new technique for frequency modulating the output of a diode laser, so that in a hydrophone application only a single-cavity demodulator is required. The local cavity is replaced by the laser cavity itself, which is an active cavity and thus introduces no attenuation in the transmitted optical beam. Both a single-mode or multi-mode diode-laser can be used, the demodulation curve corresponding in both cases to the sharp, single-cavity demodulation curve.

Thus, according to one aspect of the present invention there is provided a system for modulating the output of a diode laser of the type including a Fabry-Perot laser cavity wherein the diode-laser is mechanically coupled to a dimensionally variable transducer such that a dimensional variation in the transducer responsive to an external signal results in a dimensional variation in the laser cavity.

According to a second aspect there is provided a method of modulating the output of a solid state diode laser, the diode laser including a Fabry-Perot laser cavity comprising the steps of mechanically coupling the diode laser to a dimensionally variable transducer, and causing the transducer to vibrate by applying an external signal thereto, thereby causing the laser cavity to vibrate synchronously with the vibrating transducer.

In one embodiment there is provided a communication system comprising a solid state diode laser and a remote sensor wherein the output of the diode laser is modulated synchronously with the vibration of a dimensionally variable transducer, the diode laser being mechanically coupled to the transducer and the transducer being made to vibrate by an external signal applied thereto.

In accordance with a further embodiment there is provided a hydrophone system comprising a frequency modulated laser diode source, a length of optical fiber adapted to transmit the output of the modulated laser diode, an optical cavity sensing acoustic pressure fluctuations, a second optical fiber transmitting light from the sensor to the detector and a data-processing circuit that drives the laser modulating transducer and retrieves the required acoustical pressure signal.

These features and other advantages of the invention will become more apparent from the following detailed description when taken in conjunction with the accompanying drawings wherein;

FIG. 5 is a top view of a second embodiment of the present invention;

FIG. 6 is a view taken substantially along line 6—6 of FIG. 5;

FIG. 7 is a cross-sectional view of a further embodiment;

FIG. 8 is a top view of the embodiment of FIG. 7;

Figure 1:
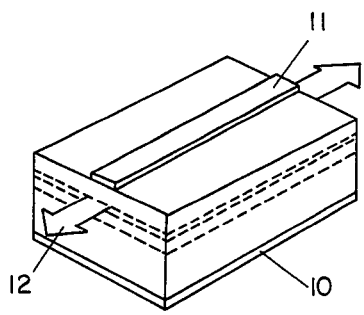
FIG. 1 is a perspective view of a solid state diode laser chip.

FIG. 1 is an illustration of a typical solid-state diode laser chip. The diode laser consists of a multilayered parallelipiped of gallium arsenide and aluminum gallium arsenide grown as a single crystal. It is to be understood, however, that diode lasers of alternate configuration or materials may be used. A full metal electrode 10 contacts one of the larger faces of the chip and a strip electrode 11 contacts the opposite face. The two smaller faces of the chip, perpendicular to the strip electrode, are polished to form partially reflecting parallel mirrors, which make up the Fabry-Perot laser cavity. Laser light 12 emerges from one of the suitably doped layers of the chip when sufficient current is passed between the electrodes.

The frequency band of the output from a diode laser depends on the band gap energy of the laser active region and is typically about 3.6 ($10^{14}$) Hz for GsAs-AlGaAs lasers. Lasing can occur for frequencies near the center of this band whenever the length of the cavity (i.e. the mirror separation) is an integral number of half-wavelengths long. The allowed optical wavelengths are therefore given by $$\lambda_n = (2L\mu/n)$$

where L is the mirror separation, $\mu$ is the reflective index of the optical wave guide ($\simeq 3.6$) and n is an integer. Thus, the output spectrum of the laser is typically a band of several discrete frequencies with wavelengths corresponding to the above expression. When the length L of the laser chip is varied by longitudinally straining the chip, each of these frequencies will be varied in inverse proportion to the strain.

Figure 2:
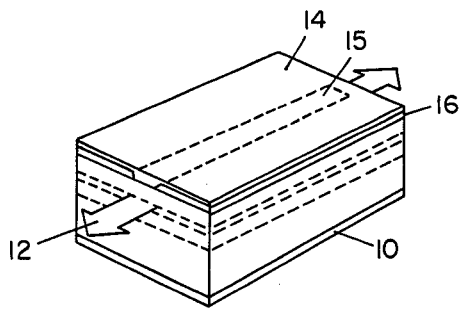
FIG. 2 is a perspective view of a laser chip illustrating a buried contact configuration.

FIG. 2 shows a diode laser chip which uses a slightly different contact design which may be advantageous for certain implementations of the present invention. Here the strip electrode 14 covers the entire upper surface of the chip but is allowed to contact the chip only along a narrow strip 15, being isolated from the remaining area by an insulating layer 16, such as $SiO_2$.

Typical dimensions for a diode laser chip are 0.3×0.2×0.1 millimeter. In operation, a direct current from a source of the order of 2 volts is typically passed between the two electrodes.

Figure 3:
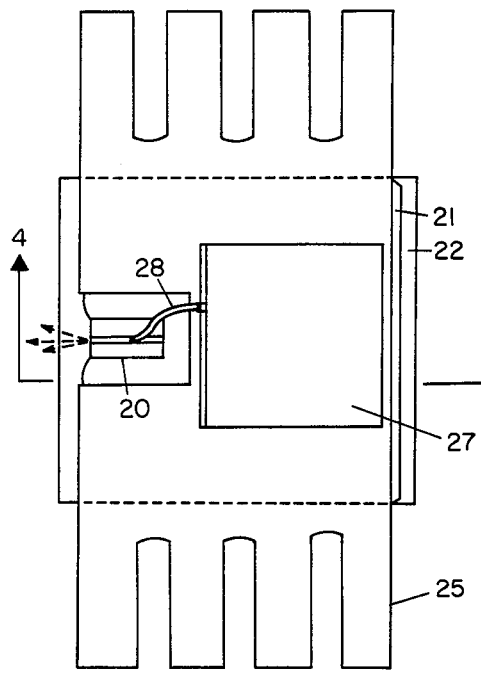
FIG. 3 is a top view of a mounting arrangement according to one embodiment of the present invention.
Figure 4A:
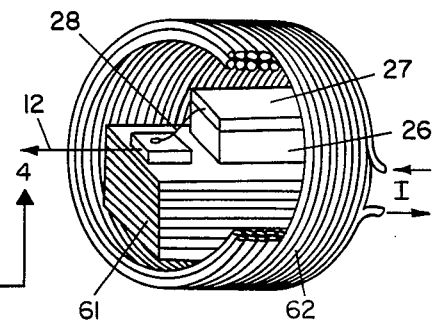
FIG. 4a illustrates a diode mounting configuration in which a magnetostrictive transducer is used.
Figure 4:
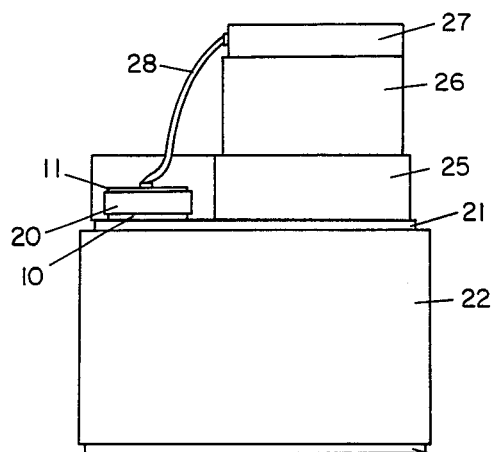
FIG. 4 is a cross-sectional view taken along the line 4—4 of FIG. 3.

FIGS. 3 and 4 show one embodiment of the transducer system whereby the frequency of the laser output is modulated. The diode laser chip 20 is mechanically coupled via an electrically conducting material such as solder to one electrode 21 of piezoelectric crystal 22. In a further variation the chip may be coupled to the transducer by means of electrically conducting silver filled epoxy. A modulating voltage is applied across the piezoelectric crystal between one electrode 21 and a second electrode 23, causing the crystal to be strained in proportion to the applied voltage. There is a corresponding variation in the length of the laser cavity, because of the mechanical bond between the piezoelectric crystal 22 and the laser chip 20. This generates the required frequency modulation of the laser beam.

Other components are also shown in FIGS. 3 and 4: A heat sink 25 of some good conductor such as copper is required to carry excess heat away from the laser chip. An insulating block 26 supports a terminal 27 which is connected via a wire 28 to the strip electrode 11 of the laser chip.

For clarity, FIGS. 3 and 4 show a laser diode having the contact design of FIG. 1; however, because the laser active region is much closer to the strip electrode surface than to the opposite surface of the chip, a better modulation index will be achieved if the design of FIG. 2 is used and the surface 14 is bonded to the piezoelectric crystal.

Differential thermal expansion between the transducer block and the chip can place high stresses on the bond joining the two components if their expansion coefficients are poorly matched. Gallium arsenide has a thermal expansion coefficient of about 5 ($10^{-6}$) per °C. (Cottam & Saunders, J. Phys. C: Solid State, Vol. 6, p 2105 ff, 1973). A piezoelectric transducer of lead zirconate titante (PZT-4) in the configuration of FIGS. 3 and 4 is fairly closely matched, having a coefficient of 3.8 ($10^{-6}$) per °C.

FIG. 4A shows a configuration similar to that of FIGS. 3 and 4 but using a magnetostrictive transducer. The block 61 is made of laminated magnetostrictive material having its direction of maximum magnetostrictive strain in the same direction as the laser axis. A coil of wire 62, with its axis parallel to the laser axis, is wound around the block and the laser chip. An electrical current I is passed through the coil to provide the required modulating signal. The resulting magnetostrictive strain in the block causes a corresponding variation in the length of the laser cavity in the same manner as for the piezoelectric transducer. A heat sink is not shown and may not be required since most magnetostrictive materials are metallic and the block itself may provide an adequate heat sink. The magnetostrictive material is laminated to reduce eddy currents at high frequencies of modulation. This effect will ultimately limit the upper modulating frequency to lower values than for piezoelectric transducers.

FIGS. 5 and 6 show a more complex implementation of the transducer system which provides better mechanical coupling of the piezoelectric strain to the laser chip and also improves the conduction of excess heat away from the chip. In this embodiment the laser chip 20 is sandwiched between two piezoelectric crystals 30 and 31 and bonded to the electrodes 32 and 33 of the two crystals. The heat sink 34 has a thin insulating layer 35 applied to one surface and is also bonded between the two electrodes 32 and 33. Hence the heat sink and insulating layer are of the same thickness as the laser chip with its electrodes. In this configuration a laser chip according to the form of FIG. 2 would be more desirable. The diode laser is driven by a direct current applied between electrodes 32 and 33. The modulating voltage is applied across the piezoelectric crystals via electrodes 32 and 33 and electrodes 37 and 38. The polarity of the piezoelectric crystals is chosen so that the piezoelectric stains are in the same direction. The small DC voltage between electrodes 32 and 33, required to drive the laser, is of no consequence to the modulating voltage.

In operation of the invention according to this embodiment the laser light emerges from the device and is coupled to a "pigtail" of monomode optical fiber 39. The fiber core is aligned with the beam emerging from the laser and is held in a stable position by some suitable means such as a transparent thermosetting plastic 40. The plastic preferably has an index of refraction matched to that of the optical fiber, preventing secondary reflections from the end of the fiber. Because the index of refraction of aluminum gallium arsenide is very high ($\simeq 3.6$), the laser cavity is not seriously affected by the thermosetting plastic.

Yet another implementation of the invention is depicted in FIGS. 7 and 8 in which the lateral surfaces of the laser chip 20 are sandwiched between two piezoelectric crystals 41 and 42 and the electrode surfaces of the laser chip are bonded electrically and mechanically to copper terminal blocks 43 and 44, which also form the heat sinks to carry excess heat away from the laser. The piezoelectric crystals have electrodes 45, 46, 47 and 48 on surfaces perpendicular to the laser beam direction, which, for many piezoelectric materials, will enhance the available piezoelectric strain along the laser beam direction. A thin insulating material 49 may be required between the heat sinks and the piezoelectric crystals so that the heat sinks do not shunt part of the electric field in the crystals. The diode laser configuration of FIG. 2 is again the most convenient for use in this implementation. Note that it is not necessary for the diode laser chip to be in close contact with the piezoelectric crystals since the terminal blocks will be strained and will transfer the strain to the laser chip.

In order to simplify the diagrams, not all of the electrical connections are shown. These are understood to be accomplished using well-known techniques. The embodiment shown in FIGS. 5-8 illustrate coupling of the laser beam to an optical fiber for signal transmission of the modulated output to a remote sensor. It is to be understood that in certain applications the laser output may be transmitted directly to a compatible detector without the aid of an optical fiber.

Figure 9:
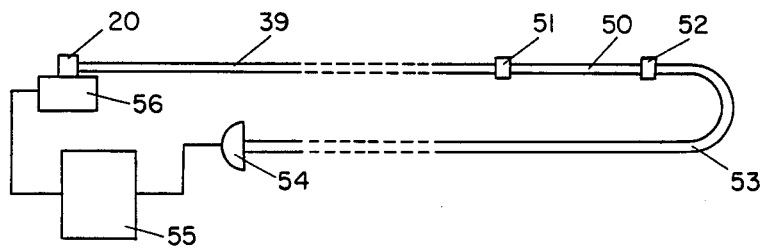
FIG. 9 is a schematic diagram of a fiber optic hydrophone employing the demodulation system of the present invention.

A schematic diagram of a fiber optic hydrophone that uses the laser modulation device is shown in FIG. 9. The laser 20 is coupled via a monomode optical fiber 39 to a sensor cavity 50, formed by inserting two partial reflectors 51 and 52 in the monomode fiber. Light emerging from the sensor cavity 50 is guided via an optical fiber 53 to detector 54. The detector provides an electrical input signal to a feedback circuit 55 which drives the laser modulating transducer 56.

In operation, the optical length of the laser cavity is maintained equal to a submultiple of the optical length of the sensing cavity by the voltage output from the feedback circuit, details of which will be given later. When such a condition is satisfied, the longitudinal modes of the laser are matched to maxima in the spectral response of the sensor cavity, so that the detected intensity is maximum. If the length of the sensor cavity varies, due to an acoustic pressure wave, a control voltage applied to the transducer re-establishes the coincidence of the response peaks.

Figure 10:
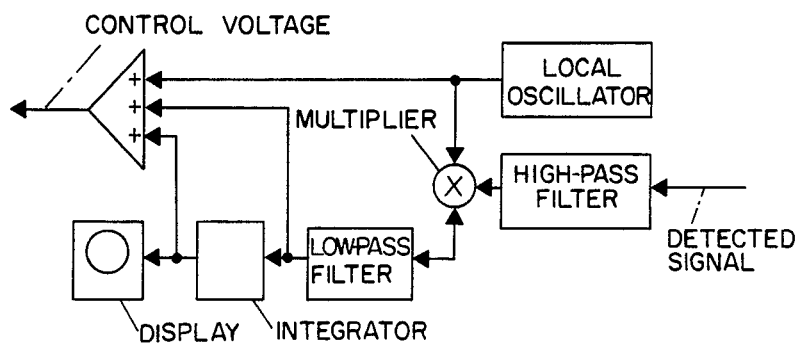
FIG. 10 illustrates a feedback circuit which may be used in conjunction with the present invention.

FIG. 10 gives a possible implementation of the feedback circuit. The control voltage applied to the transducer is the sum of three signals: (i) a high frequency (several kilohertz) signal which generates a fluctuation of the laser modes about the maxima of the spectral response of the sensor cavity; (ii) a correction signal which re-centers the oscillating modes on the response peaks at each cycle; (iii) the retrieved signal, obtained by integrating over time the correction signal, which represents the pressure fluctuations at the sensor cavity.

The maximum modulating frequency that can be used in the implementations described above is limited by the sound velocity in the piezoelectric crystals and/or the laser chip. If modulation is to be achieved by longitudinal strain of the chip the chip can be no more than one-half wavelength long. For a chip of 0.5 mm length and a sound velocity of 4000 m/sec, the maximum modulating frequency is 4 MHz. In some communications systems this may be restrictive, although not for the proposed hydrophone application, and it is probable that much higher modulating frequencies can be achieved by subjecting the laser diode to a transverse pressure wave. Then the limiting dimension would be the lasing region of the chip which is about 5 $\mu$m wide and 1 $\mu$m thick. In this case the principal modulating mechanism would be the refractive index change in the aluminum gallium arsenide due to the pressure wave, rather than the length change of the laser.

From the foregoing it will be apparent that a new and useful method of varying the output of a solid state diode laser has been described. The output which is modulated in synchronism with a controllable modulating source may be used to communicate information via line of sight communication systems or through an optical fiber link.

What we claime is:

1. A hydrophone system comprising a diode laser source, a length of optical fiber adapted to transmit the output of the diode laser, a Fabry-Perot optical cavity sensing acoustic pressure fluctuations, a second optical fiber transmitting light from the sensor to a detector and a data-processing circuit that generates a signal representing said acoustical pressure fluctuations, wherein the output of the diode laser source is modulated by a dimensionally variable transducer mechanically coupled thereto, in response to an input from said data processing circuit.

2. The system of claim 1 wherein the transducer is piezoelectric crystal.

3. The system of claim 1 wherein the transducer is a magnetostrictive element.

4. The system of claims 1, 2 or 3 wherein the laser diode is mechanically coupled to said transducer by soldering.

5. The system of claim 1 wherein said diode laser is sandwiched between two piezoelectric crystals.

* * * * *